US009251917B2

United States Patent
Noh (10) Patent No.: US 9,251,917 B2
(45) Date of Patent: Feb. 2, 2016

(54) MEMORY DEVICE AND DEFECTIVE ADDRESS REPAIR METHODS THEREOF

(71) Applicant: SK hynix Inc., Gyeonggi-do (KR)

(72) Inventor: Young-Kyu Noh, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/523,496

(22) Filed: Oct. 24, 2014

(65) Prior Publication Data

US 2015/0294740 A1 Oct. 15, 2015

(30) Foreign Application Priority Data

Apr. 14, 2014 (KR) .......................... 10-2014-0044176

(51) Int. Cl.
| | | |
|---|---|---|
| *G11C 29/44* | (2006.01) | |
| *G06F 11/16* | (2006.01) | |
| *G11C 29/00* | (2006.01) | |
| *G11C 29/12* | (2006.01) | |
| *G11C 29/18* | (2006.01) | |
| *G11C 29/16* | (2006.01) | |
| *G06F 11/27* | (2006.01) | |

(52) U.S. Cl.
CPC ........ *G11C 29/4401* (2013.01); *G11C 29/1201* (2013.01); *G11C 29/18* (2013.01); *G11C 29/70* (2013.01); *G11C 29/785* (2013.01); *G06F 11/27* (2013.01); *G11C 29/16* (2013.01)

(58) Field of Classification Search
CPC .. G11C 29/4401; G11C 29/785; G11C 29/70; G11C 29/18; G11C 29/1201; G11C 29/16; G06F 11/27
See application file for complete search history.

(56) References Cited

U.S. PATENT DOCUMENTS

| | | | |
|---|---|---|---|
| 6,667,902 B2 | 12/2003 | Peng | |
| 6,777,757 B2 | 8/2004 | Peng et al. | |
| 6,940,751 B2 | 9/2005 | Peng et al. | |
| 7,173,851 B1 | 2/2007 | Callahan et al. | |
| 7,269,047 B1 | 9/2007 | Fong et al. | |
| 7,746,712 B2 | 6/2010 | Kang et al. | |
| 2003/0164510 A1* | 9/2003 | Dono | 257/200 |
| 2006/0031726 A1* | 2/2006 | Zappa et al. | 714/718 |
| 2008/0065929 A1* | 3/2008 | Nadeau-Dostie et al. | 714/5 |
| 2013/0227344 A1* | 8/2013 | Sohn et al. | 714/6.21 |

FOREIGN PATENT DOCUMENTS

KR 1020140059682 5/2014

* cited by examiner

*Primary Examiner* — Richard Elms
*Assistant Examiner* — Ajay Ojha
(74) *Attorney, Agent, or Firm* — IP & T Group LLP (57) ABSTRACT

A memory device includes a memory array, a test circuit suitable for detecting a first repair address corresponding to a defective cell in the memory array, in a test mode, an external input circuit suitable for receiving a second repair address from an exterior, in response to an address input command, in an external input mode, and a nonvolatile memory circuit suitable for programming the first repair address in a first region in response to a first program command in the test mode, and programming the second repair address in a second region in response to a second program command in the external input mode, wherein the first repair address is programmed in the second region in response to the second program command while the address input command is deactivated in the external input mode.

11 Claims, 4 Drawing Sheets

MEMORY DEVICE AND DEFECTIVE ADDRESS REPAIR METHODS THEREOF

CROSS-REFERENCE TO RELATED APPLICATIONS

The present application claims priority of Korean Patent Application No. 10-2014-0044176, filed on Apr. 14, 2014, which is incorporated herein by reference in its entirety.

BACKGROUND

1. Field

Exemplary embodiments of the present invention relate to a memory device, an operation method thereof, and more particularly, to a repair technology.

2. Description of the Related Art

Figure 1:
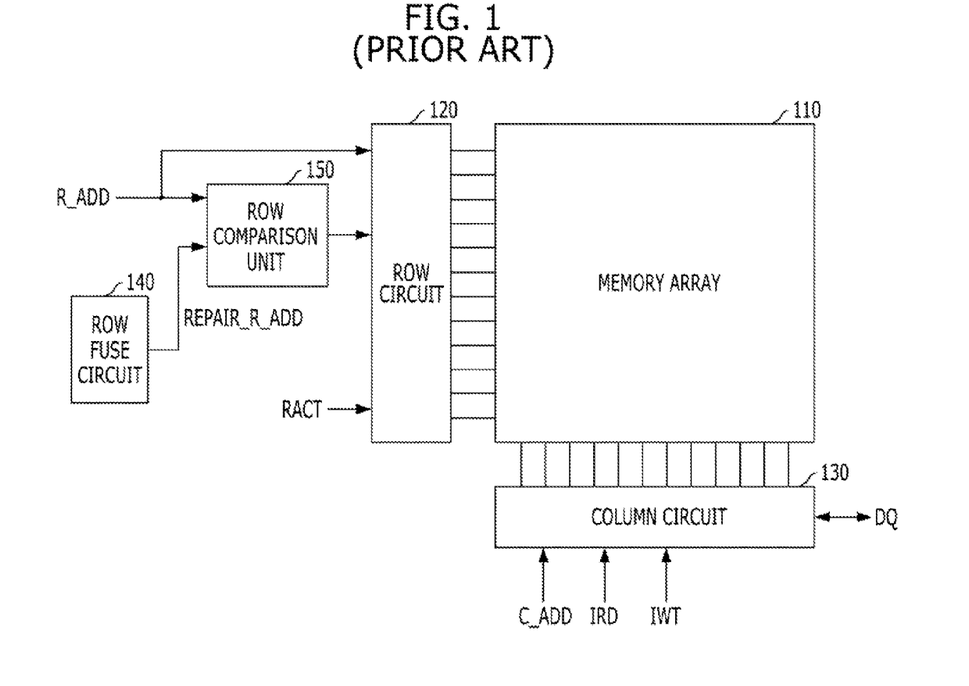
FIG. 1 is a diagram explaining a repair operation in a conventional memory device (for example, a DRAM).

FIG. 1 is a diagram explaining a repair operation in a conventional memory device (for example, a DRAM).

A memory device may include a plurality of memory banks and one of the memory banks is shown in FIG. 1. Referring to FIG. 1, the memory device includes a memory array 110 which includes a plurality of memory cells, a row circuit 120 for activating a word line selected by a row address R_ADD, and a column circuit 130 for accessing (reading or writing) data DATA of a bit line selected by a column address C_ADD.

A row fuse circuit 140 stores a row address corresponding to a defective memory cell in the memory array 110, as a repair row address REPAIR_R_ADD. A row comparison unit 150 compares the repair row address REPAIR_R_ADD stored in the row fuse circuit 140 and the row address R_ADD inputted from an exterior of the memory device. If the repair row address REPAIR_R_ADD and the row address R_ADD correspond to each other, the row comparison unit 150 controls the row circuit 120 to activate a redundancy word line instead of a word line designated by the row address R_ADD. That is to say, a row (word line) corresponding to the repair row address REPAIR_R_ADD stored in the row fuse circuit 140 is replaced with a redundancy row (word line).

In the drawing, the reference symbol RACT represents a signal which is activated in response to an active command for commanding the activation of a word line in the memory array 110 and deactivated in response to a precharge command for commanding the deactivation of a word line in the memory array 110. Also, the reference symbol IRD represents a read command, and the reference symbol IWT represents a write command.

In the conventional row fuse circuit 140, laser fuses are generally included and used. Laser fuses store high or low logic level of data depending on whether the laser fuses are cut or not. Although laser fuses may be programmed in a wafer level of a memory device, it is not possible to program the laser fuses after a wafer is mounted in a package. Also, it is difficult to design the laser fuses smaller than a certain size because of limitations in decreasing the pitch length thereof.

In order to overcome such issues, a nonvolatile memory such as an E-fuse array circuit, a NAND flash memory a NOR flash memory, an MRAM (magnetoresistive random access memory), an STT-MRAM (spin transfer torque magnetoresistive random access memory), a ReRAM (resistive random access memory) and a PC RAM (phase change random access memory) as disclosed in U.S. Pat. Nos. 6,940,751, 6,777,757, 6,667,902, 7,173,851 and 7,269,047 is included in a memory device, and repair information (repair addresses) is stored in the nonvolatile memory, for use.

Figure 2:
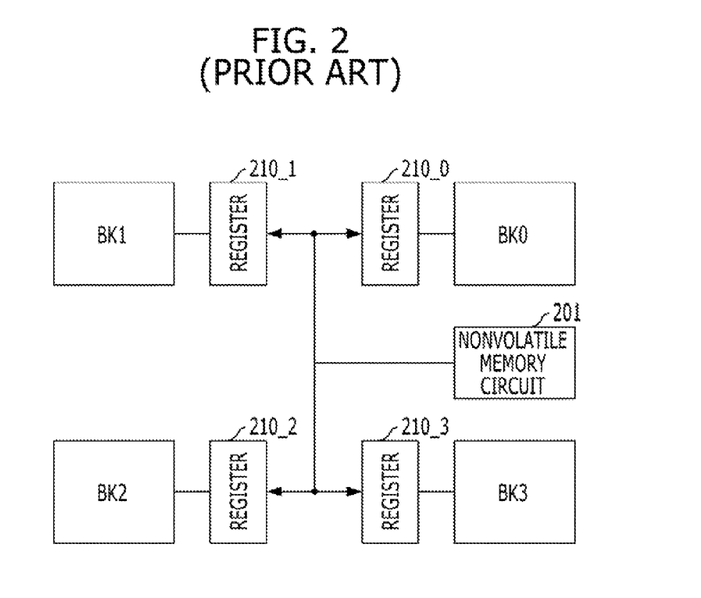
FIG. 2 is a diagram showing the use of a nonvolatile memory circuit to store repair information in a memory device.

FIG. 2 is a diagram showing the use of a nonvolatile memory circuit to store repair information in a memory device.

Referring to FIG. 2, the memory device includes a plurality of memory banks BK0 to BK3, registers 210_0 to 210_3 which are provided in the respective memory banks BK0 to BK3 to store repair information, and a nonvolatile memory circuit 201.

The nonvolatile memory circuit 201 is a substitution circuit for the row fuse circuit 140 shown in FIG. 1. Repair information, that is, repair addresses, corresponding to all the banks BK0 to BK3 is stored in the nonvolatile memory circuit 201. The nonvolatile memory circuit 201 may be any one of nonvolatile memories such as an E-fuse array circuit, a NAND flash memory, a NOR flash memory, an MRAM (magnetoresistive random access memory), an STT-MRAM (spin transfer torque magnetoresistive random access memory), a ReRAM (resistive random access memory) and a PC RAM (phase change random access memory).

The registers 210_0 to 210_3 are provided in the respective memory banks BK0 to BK3 and store repair information of the respective memory banks BK0 to BK3. The register 210_0 stores the repair information of the memory bank BK0, and the register 210_2 stores the repair information of the memory bank BK2. The registers 210_0 to 210_3 may include latch circuits, and may store the repair information only while power is supplied. The repair information to be stored in the registers 210_0 to 210_3 is transmitted from the nonvolatile memory circuit 201.

The repair information stored in the nonvolatile memory circuit 201 is transmitted to and stored in the registers 210_0 to 210_3 to be used for a repair operation. Since the nonvolatile memory circuit 201 is configured in an array, a predetermined time is required to call the data stored in the nonvolatile memory circuit 201. Because the memory device cannot make an immediate call for the data stored in the nonvolatile memory circuit 201, it is impossible to perform a repair operation by directly using the data stored in the nonvolatile memory circuit 201. Therefore, a boot-up operation, in which the repair information stored in the nonvolatile memory circuit 201 is transmitted to and stored in the registers 210_0 to 210_3, is performed, and a repair operation is performed using the repair information stored in the registers 210_0 to 210_3, after the boot-up operation is performed.

As the row fuse circuit 140 configured by laser fuses replaced with the nonvolatile memory circuit 201 and the registers 210_0 to 210_3 it is possible to repair an additional defect which occurs in a wafer and next level of a memory device. Meanwhile, research has been made for a technology capable of repairing a defect occurring after the fabrication of a semiconductor memory device by accessing the nonvolatile memory circuit 201 even after the fabrication of the semiconductor memory device (for example, after the sale of a product).

SUMMARY

Various embodiments are directed to various technologies for programming a nonvolatile memory circuit in a memory device to repair the memory device.

In an embodiment, a memory device may include a memory array, a test circuit suitable for detecting a first repair address corresponding to a defective cell in the memory array, in a test mode, an external input circuit suitable for receiving a second repair address from an exterior, in response to an address input command, in an external input mode, and a nonvolatile memory circuit including a first region and a second region, and suitable for programming the first repair address in the first region in response to a first program command in the test mode, and programming the second repair address in the second region in response to a second program command in the external input mode, wherein the first repair address is programmed in the second region in response to the second program command while the address input command is deactivated in the external input mode.

The test circuit may write the same data in two or more memory cells in the memory array, and may detect a defective cell of the two or more memory cells by determining whether or not data read from the two or more memory cells is the same. The external input mode may be a post package repair (PPR) mode, and the address input command may be an active command.

In an embodiment, an operation method of a memory device may include detecting a first defective cell through a test operation, and programming a first repair address corresponding to the first defective cell in a first region of a nonvolatile memory in response to a first program command, in a test mode, receiving a second repair address in response to an address input command, and programming the second repair address in a second region of the nonvolatile memory in response to a second program command, in an external input mode, and detecting a second defective cell through the test operation in the test mode, and programming a third repair address corresponding to the second defective cell in the second region of the nonvolatile memory in response to the second program command in the external input mode.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

In the drawings thicknesses and lengths of components are exaggerated compared to actual physical thickness and intervals for convenience of illustration. In the following description, a detailed explanation of known related functions and constitutions may be omitted to avoid unnecessarily obscuring the subject manner of the present invention. Furthermore, 'connected/coupled' represents that one component is directly coupled to another component or indirectly coupled through another component. In this specification, a singular form may include a plural form, and vice versa, as long as it is not specifically mentioned. Furthermore, 'include/comprise' or 'including/comprising' used in the specification represents that one or more components, steps, operations, and elements exist or are added.

Figure 3:
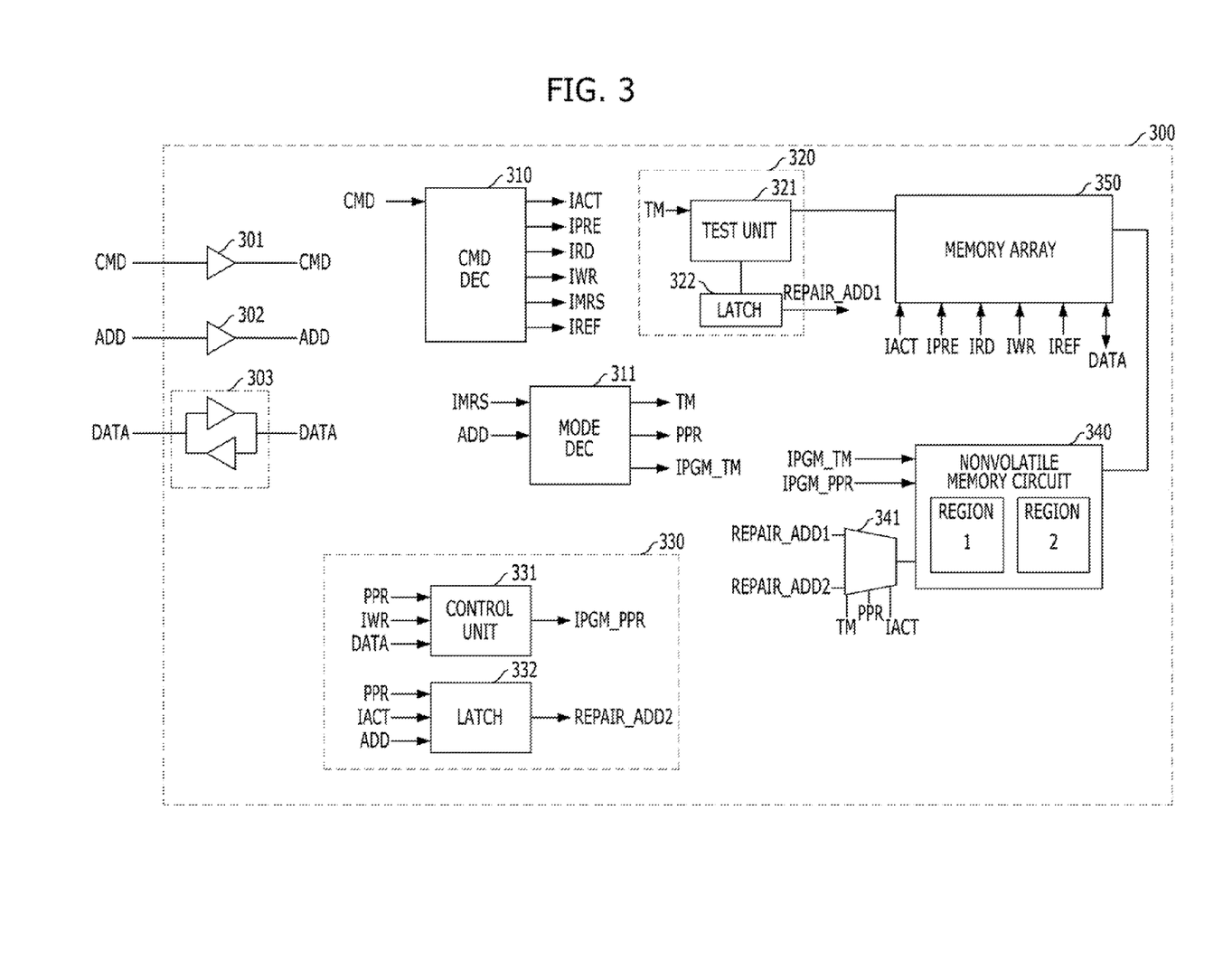
FIG. 3 is a configuration diagram of a memory device 300 in accordance with an embodiment.

FIG. 3 is a configuration diagram of a memory device 300 in accordance with an embodiment.

Referring to FIG. 3, the memory device 300 may include a command reception unit 301, an address reception unit 302, a data transmission/reception unit 303, a command decoder 310, a mode decoder 311, a test circuit 320, an external input circuit 330, a nonvolatile memory circuit 340, a memory array 350, and a selection unit 341.

The command reception unit 301 may receive a command CMD which is inputted from an exterior of the memory device 300. The command CMD may include a plurality of signals. The signals included in the command CMD may be a chip select signal (CS), an active signal (ACT), a row address strobe signal (RAS), a column address strobe signal (CAS), and a write enable signal (WE).

The address reception unit 302 may receive an address ADD which is inputted from an exterior of the memory device 300 and includes multiple bits. The address ADD may include a normal address and a bank address which mean a row address and a column address. Since the bank address is for addressing of a bank as a large unit, the bank address may be referred to as an upper address. Since the normal address is for addressing of a memory cell in a bank, the normal address may be referred to as a lower address. The row address and the column address may be inputted through the same pad. The address inputted in synchronization with a row address strobe signal may be recognized as a row address by the memory device 300, and the address inputted in synchronization with a column address strobe signal may be recognized as a column address by the memory device 300.

The data transmission/reception unit 303 may receive multi-bit data DATA which is inputted from an exterior of the memory device 300 or may output data DATA to an exterior of the memory device 300. For example, data to be written in the memory array 350 may be received through the data transmission/reception unit 303, and data read from the memory array 350 may be outputted through the data transmission/reception unit 303 to the exterior of the memory device 300.

The command decoder 310 decodes the command CMD which is received through the command reception unit 301, and generates various internal commands. The internal commands generated by the command decoder 310 may include an active command IACT, a precharge command IPRE, a read command IRD, a write command IWT, a setting command IMRS, and a refresh command IREF.

The mode decoder 311 may decode the address ADD and set various parameters necessary for the operation of the memory device 300, when the setting command IMRS is activated by the command decoder 310. Also, the mode decoder 311 may decode the address ADD and control various operation modes of the memory device 300, when the setting command IMRS is activated. As the operation modes controlled by the mode decoder 311, there may be a test mode and an external input mode. The mode decoder 311 may activate a test mode signal TM in the test mode, and may activate an external input mode signal PPR in the external input mode. Meanwhile, the mode decoder 311 may decode the address ADD and generate a first program command IPGM_TM, when the setting command IMRS is activated. The first program command IPGM_TM may be a command for programming the address of a defective cell, which is detected in the test mode by the test circuit 320, in the nonvolatile memory circuit 340.

The test circuit 320 may perform a test operation for detecting a defective cell in the memory array 350, in the test mode in which the test mode signal TM is activated. The test circuit 320 may test the memory array 350 by using the commands IACT, IPRE, IRD, IWR and IREF generated by the command decoder 310, or by generating control signals by itself. The test circuit 320 may write the same data in at least two memory cells of the memory array 350, read data from the at least two memory cells, and detect a defective cell by comparing the data. For example, when data of '1' are written in two memory cells, it may be seen that any one of the two memory cells is defective in the case where the data read from the two memory cells is different from each other, and, it may be seen that the two memory cells are normal in the case where the data read from the two memory cells are the same. The test circuit 320 may include a test unit 321 for performing the test operation and a latch 322 for temporarily storing a first repair address REPAIR_ADD1 corresponding to a defective cell detected by the test operation of the test unit 321.

The external input circuit 330 may temporarily store a second repair address REPAIR_ADD2, which is inputted from an exterior, response to an address input command IACT in the external input mode, and may control the operation of the external input mode. The external input circuit 330 may include a control unit 331 and a latch 332. The latch 332 may temporarily store the address ADD inputted through the address reception unit 302, as the second repair address REPAIR_ADD2, when the address input command IACT is activated in the external input mode in which the external input mode signal PPR is activated. The external input mode may be a post package repair mode. While the active command IACT commands an active operation in a normal mode, it commands an operation of receiving a repair address from the exterior of the memory device 300 in the external input mode. Therefore, the active command IACT activated in the external input mode is referred to as the address input command. The control unit 331 may generate a second program command IPGM_PPR in response to the activation of the write command IWR and the logic level of the entirety or a part of the data DATA inputted from the exterior, in the external input mode. In detail, the control unit 331 may activate the second program command IPGM_PPR in the case where a logic low level of data is inputted to a $0^{th}$ data pin a write latency of time after the write command IWR is activated in the external input mode.

The selection unit 341 may select a repair address to be transmitted to the nonvolatile memory circuit 340. The selection unit 341 may transmit the first repair address REPAIR_ADD1 to the nonvolatile memory circuit 340 in the test mode in which the test mode signal TM is activated. Further, in the external input mode in which the external input mode signal PPR is activated, the selection unit 341 may transmit the first repair address REPAIR_ADD1 to the nonvolatile memory circuit 340 in the case where the address input command IACT has never been activated after entering the external input mode, and may transmit the second repair address REPAIR_ADD2 to the nonvolatile memory circuit 340 in the case where the address input command IACT is activated after entering the external input mode.

The nonvolatile memory circuit 340 may include a first region REGION1 and a second region REGION2 for storing repair addresses. Primarily, the first repair address REPAIR_ADD1 detected in the test mode is programmed (stored) in the first region REGION1, and the second repair address REPAIR_ADD2 inputted in the external input mode is programmed in the second region REGION2. However, as will be described later, the uses of the first region REGION1 and the second region REGION2 may be converted therebetween. The repair address transmitted by the selection unit 341 may be programmed in the first region REGION1 in the case where the first program command IPGM_TM is activated. The repair address transmitted by the selection unit 341 may be programmed in the second region REGION2 in the case where the second program command IPGM_PPR is activated. The repair address programmed in the nonvolatile memory circuit 340 may be transmitted to the memory array 350 in a boot-up operation and used to repair defective cells in memory banks. The nonvolatile memory circuit 340 may be any one of nonvolatile memories such as an E-fuse array circuit, a NAND flash memory, a NOR flash memory, an MRAM (magnetoresistive random access memory), an STT-MRAM (spin transfer torque magnetoresistive random access memory), a ReRAM (resistive random access memory) and a PC RAM (phase change random access memory).

The memory array 350 may include a plurality of memory banks and a plurality of registers. The plurality of memory banks may perform operations designated by the active, precharge, read, write and refresh commands IACT, IPRE, IRD, IWR and IREF, and the plurality of registers may store repair addresses transmitted from the nonvolatile memory circuit 340. The repair addresses stored in the plurality of registers may be used to repair defective cells in the memory banks. The banks BK0 to BK3 and the registers 210_0 to 210_3 shown in FIG. 2 may correspond to the memory array 350.

Hereinbelow, three methods of programming the nonvolatile memory circuit 340 for the repair of the memory array 350 in the memory device 300 will be described with reference to FIGS. 4 to 6.

Figure 4:
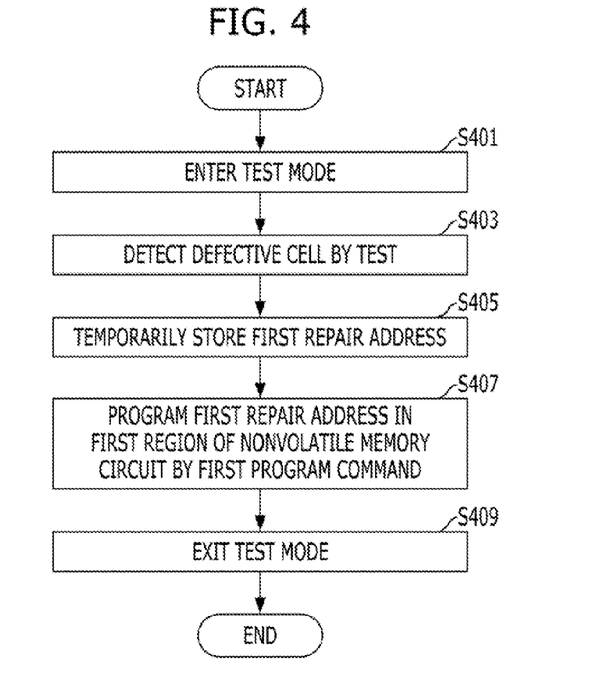
FIG. 4 is a flow chart explaining an operation method of the memory device 300 in accordance with an embodiment.

FIG. 4 is a flow chart explaining an operation method of the memory device 300 in accordance with an embodiment. In FIG. 4, processes of detecting the first repair address REPAIR_ADD1 corresponding to a defective cell, by testing the memory device 300, and programming the detected first repair address REPAIR_ADD1 in the first region REGION1 of the nonvolatile memory circuit 340 will be described.

Referring to FIG. 4, first, the memory device 300 may enter the test mode (S401). This may be implemented as the command decoder 310 decodes the command CMD and activates the setting command IMRS and the mode decoder 311 decodes the address ADD in response to the activation of the setting command IMRS and activates the test mode signal TM.

After entering the test mode, the memory device 300 may perform a test for the memory array 350, and as a result, a defective cell of the memory array 350 may be detected (S403). This may be implemented by controlling the test circuit 320 to perform write and read operations for the memory array 350. In detail, the same data may be written in at least two memory cells in the memory array 350, and whether a defect has occurred may be determined by determining whether the data read from the at least two memory cells are the same.

A repair address corresponding to a defective cell detected by the test operation of the test circuit 320 may be referred to as the first repair address REPAIR_ADD1, and the first repair address REPAIR_ADD1 may be temporarily stored in the latch 322 (S405).

Thereafter, if the first program command IPGM_TM is activated, the first repair address REPAIR_ADD1, which is temporarily stored in the latch 322, may be programmed in the first region REGION1 of the nonvolatile memory circuit 340 (S407). The mode decoder 311 may activate the first program command IPGM_TM. Meanwhile, in the test mode, the selection unit 341 may transmit the first repair address REPAIR_ADD1 to the nonvolatile memory circuit 340.

After the first repair address REPAIR_ADD1 is programmed in the nonvolatile memory circuit 340, the memory device 300 may exit the test mode (S409). The exit from the test mode may be implemented in the same manner as the entry to the test mode.

The repair scheme as in FIG. 4 may be executed in a package test process of the memory device 300.

Figure 5:
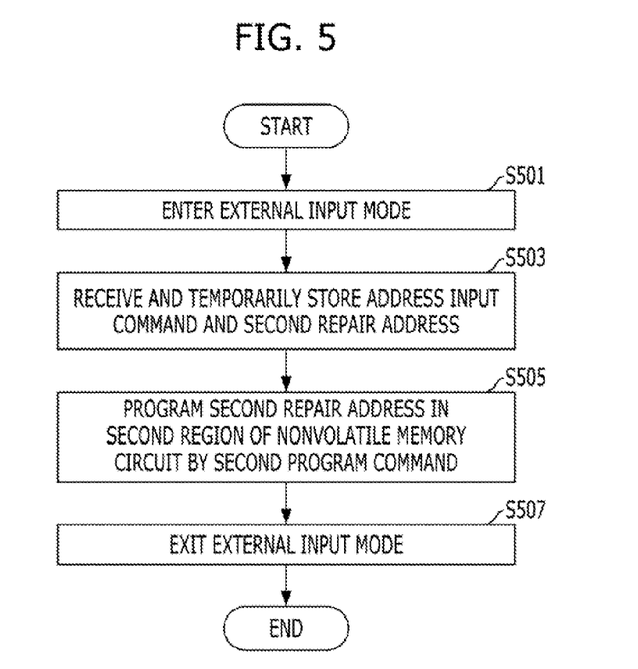
FIG. 5 is a flow chart explaining an operation method of the memory device 300 in accordance with an embodiment.

FIG. 5 is a flow chart explaining an operation method of the memory device 300 in accordance with an embodiment. In FIG. 5, a process of programming the second repair address REPAIR_ADD2 inputted from the exterior of the memory device 300 in the external input mode, in the second region REGION2 of the nonvolatile memory circuit 340, will be described.

Referring to FIG. 5, first, the memory device 300 may enter the external input mode (S501). This may be implemented as the command decoder 310 decodes the command CMD and activates the setting command IMRS and the mode decoder 311 decodes the address ADD in response to the activation of the setting command IMRS and activates the external input mode signal PPR.

After entering the external input mode, with the activation of the address input command IACT, the memory device 300 may receive a repair address through the address reception unit 302 (S503). The latch 332 may temporarily store the repair address received through the address reception unit 302, as the second repair address REPAIR_ADD2, in response to the address input command IACT. As mentioned above, while the active command IACT is a command for commanding an active operation, in the normal mode, the active command IACT may serve as a command for informing the input of the second repair address REPAIR_ADD2 through the address reception unit 302 from the exterior of the memory device 300, in the external input mode.

If the second program command IPGM_PPR is activated, in response, the second repair address REPAIR_ADD2 stored in the latch 332 may be programmed in the second region REGION2 of the nonvolatile memory circuit 340 (S505). The control unit 331 may activate the second program command IPGM_PPR. The control unit 331 may activate the second program command IPGM_PPR in the case where the data of a $0^{th}$ data pin among the data inputted through the data transmission/reception unit 303, which is inputted a latency of time after the write command IWR is activated in the external input mode, has a logic low level. Meanwhile, since the address input command IACT is activated once after entering the external input mode the selection unit 341 may transmit the second repair address REPAIR_ADD2 to the nonvolatile memory circuit 340.

After the second repair address REPAIR_ADD2 is programmed in the second region REGION2 of the nonvolatile memory circuit 340, the memory device 300 may exit the external input mode (S507). The exit from the external input mode may be implemented in the same manner as the entry to the external input mode.

The repair scheme as in FIG. 5 may be executed after the memory device 300 is mounted to an application (a system using a memory device).

Figure 6:
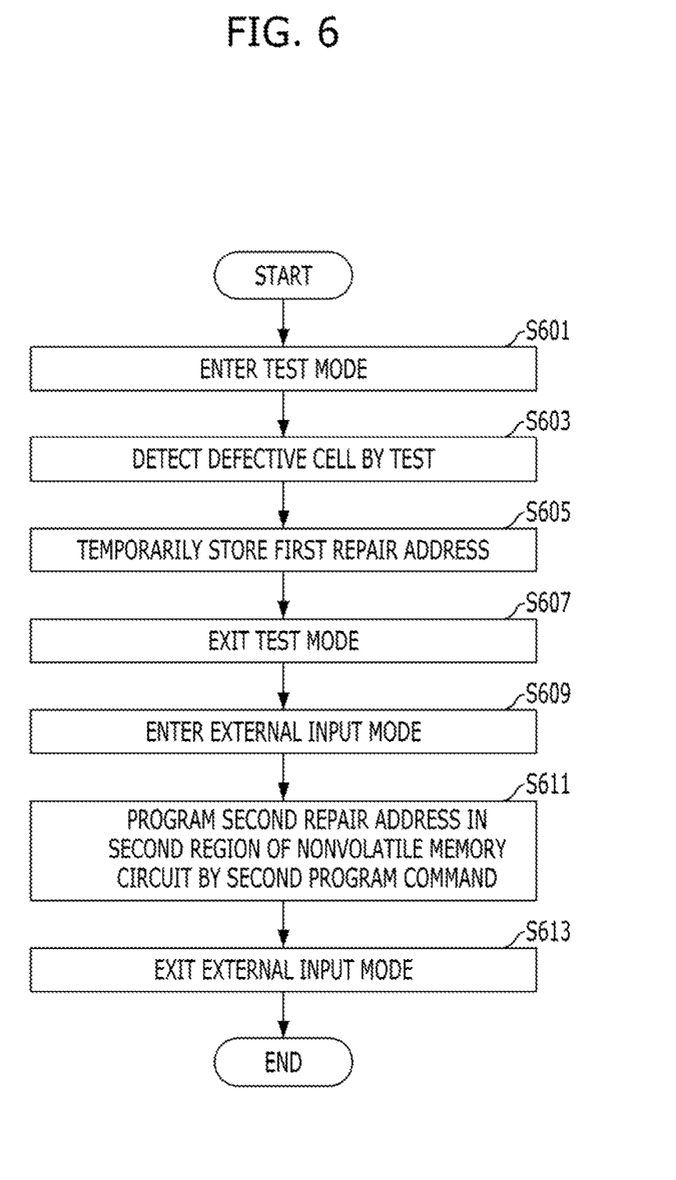
FIG. 6 is a flow chart explaining an operation method of the memory device 300 in accordance with an embodiment.

FIG. 6 is a flow chart explaining an operation method of the memory device 300 in accordance with an embodiment. In FIG. 6, a process of programming the first repair address REPAIR_ADD1 detected by the test circuit 320, in not the first region REGION1 but the second region REGION2 of the nonvolatile memory circuit 340, will be described.

Referring to FIG. 6, first, the memory device 300 may enter the test mode (S601). This may be implemented as the command decoder 310 decodes the command CMD and activates the setting command IMRS and the mode decoder 311 decodes the address ADD in response to the activation of the setting command IMRS and activates the test mode signal TM.

After entering the test mode, the memory device 300 may perform a test for the memory array 350, and as a result, a defective cell of the memory array 350 may be detected (S603). This may be implemented by controlling the test circuit 320 to perform write and read operations for the memory array 350. In detail, the same data may be written in at least two memory cells in the memory array 350, and whether a defect has occurred may be determined by determining whether the data read from the at least two memory cells is the same.

A repair address corresponding to a defective cell detected by the test operation of the test circuit 320 may be referred to as the first repair address REPAIR_ADD1, and the first repair address REPAIR_ADD1 may be temporarily stored in the latch 322 (S605).

Thereafter, the activation of the first program command IPGM_TM is omitted, and the memory device 300 may exit the test mode (S607). The exit from the test mode may be implemented in the same manner as the entry to the test mode.

After the exit from the test mode, the memory device 300 may enter the external input mode (S609). This may be implemented as the command decoder 310 decodes the command CMD and activates the setting command IMRS and the mode decoder 311 decodes the address ADD in response to the activation of the setting command IMRS and activates the external input mode signal PPR.

After entering the external input mode, the first repair address REPAIR_ADD1 stored in the latch 322 may be programmed in the second region REGION2 of the nonvolatile memory circuit 340, as the second program command IPGM_PPR is activated without the activation of the address input command IACT (S611). The control unit 331 may activate the second program command IPGM_PPR. The control unit 331 may activate the second program command IPGM_PPR in the case where the data of a $0^{th}$ data pin among the data inputted through the data transmission/reception unit 303, which is inputted a write latency of time after the write command IWR is activated in the external input mode, has a low level. Since the address input command IACT has never been activated after entering the external input mode, the selection unit 341 may transmit the first repair address REPAIR_ADD1 to the nonvolatile memory circuit 340.

After the first repair address REPAIR_ADD1 is programmed in the second region REGION2 of the nonvolatile memory circuit 340, the memory device 300 may exit the external input mode (S613). The exit from the external input mode may be implemented in the same manner as the entry to the external input mode.

According to FIG. 6, the first repair address REPAIR_ADD1 is detected by entering the test mode, and the memory device 300 exits the test mode without programming the detected first repair address REPAIR_ADD1 in the nonvolatile memory circuit 340. Further, the reception of the second repair address REPAIR_ADD2 from the exterior is omitted after entering the external input mode, and the memory device 300 exits the external input mode after the first repair address REPAIR_ADD1 detected in advance is programmed in the second region REGION2 of the nonvolatile memory circuit 340. Namely, the first repair address REPAIR_ADD1 detected by the test mode may be programmed in not the first region REGION1 but the second region REGION2 of the nonvolatile memory circuit 340. Such a scheme may be used to program the detected first repair address REPAIR_ADD1 in the second region REGION2 in which usable space is left, in the case where the first region REGION1 is fully used in the nonvolatile memory circuit 340 and a programmable space no longer exists in the first region REGION1. According to the operation scheme of FIG. 6, the regions REGION1 and REGION2 in the nonvolatile memory circuit 340 may be freely used.

As is apparent from the above descriptions, according to the embodiments, a repair address corresponding to a defective cell detected under a test mode may be programmed in a region allocated for an external input mode in a nonvolatile memory circuit.

Accordingly, advantages are provided in that regions in the nonvolatile memory circuit may be flexibly used.

Although various embodiments have been described for illustrative purposes, it will be apparent to those skilled in the art that various changes and modifications may be made without departing from the spirit and scope of the invention as defined in the following claims.

What is claimed is:

1. A memory device comprising:
   a memory array;
   a test circuit suitable for detecting a first repair address corresponding to a defective cell in the memory array, in a test mode;
   an external input circuit suitable for receiving a second repair address from an exterior, in response to an address input command, in an external input mode; and
   a nonvolatile memory circuit including a first region and a second region, and suitable for programming the first repair address in the first region in response to a first program command in the test mode, and programming the second repair address in the second region in response to a second program command in the external input mode, wherein the first repair address is programmed in the second region in response to the second program command while the address input command is deactivated in the external input mode,
   wherein the test circuit writes the same data in two or more memory cells in the memory array, and detects a defective cell of the two or more memory cells by determining whether data read from the two or more memory cells is the same.

2. The memory device according to claim 1, wherein the external input mode is a post package repair (PPR) mode, and the address input command is an active command.

3. The memory device according to claim 2, wherein the external input circuit comprises:
   a latch suitable for temporarily storing the second repair address in response to the active command in the external input mode; and
   a control unit suitable for generating the second program command in response to an activation of a write command and a logic level of an entirety or a part of data inputted from the exterior, in the external input mode.

4. The memory device according to claim 3, wherein the control unit determines whether to activate the second program command, by checking if a first value of data is inputted to a $0^{th}$ data pad a predetermined time after the write command is activated in the external input mode.

5. The memory device according to claim 1, further comprising:
   a selection unit suitable for transmitting the first repair address to the nonvolatile memory circuit in the test mode, and transmitting the first repair address to the nonvolatile memory circuit before the address input command is activated and the second repair address to the nonvolatile memory circuit after the address input command is activated, in the external input mode.

6. An operation method of a memory device, comprising:
   detecting a first defective cell through a test operation, and programming a first repair address corresponding to the first defective cell in a first region of a nonvolatile memory in response to a first program command, in a test mode;
   receiving a second repair address in response to an address input command, and programming the second repair address in a second region of the nonvolatile memory in response to a second program command, in an external input mode; and
   detecting a second defective cell through the test operation in the test mode, and programming a third repair address corresponding to the second defective cell in the second region of the nonvolatile memory in response to the second program command in the external input mode,
   wherein the test operation comprises:
   writing same data in two or more memory cells in a memory array; and
   determining whether data read from the two or more memory cells is the same.

7. The operation method according to claim 6, wherein the detecting of the first defective cell and the programming of the first repair address comprises:
   entering the test mode;
   detecting the first defective cell through the test operation;
   temporarily storing the first repair address corresponding to the first defective cell; and
   programming the first repair address in the first region of the nonvolatile memory in response to the first program command.

8. The operation method according to claim 7, wherein the receiving of the second repair address and the programming of the second repair address comprises:
   entering the external input mode;
   temporarily storing the second repair address which is inputted together with the address input command; and
   programming the second repair address in the second region of the nonvolatile memory in response to the second program command.

9. The operation method according to claim 7, wherein the detecting of the second defective cell and the programming of the third repair address comprises:
   entering the test mode;
   detecting the second defective cell through the test operation;
   temporarily storing the third repair address corresponding to the second defective cell;
   exiting the test mode, and entering the external input mode; and
   programming the third repair address in the second region of the nonvolatile memory in response to the second program command.

10. The operation method according to claim 9, wherein the external input mode is a post package repair (PPR) mode.

11. The operation method according to claim 10, wherein the programming of the third repair address in the second region of the nonvolatile memory in response to the second program command comprises:
- checking application of a write command;
- generating the second program command by checking a logic level of an entirety or a part of data inputted from an exterior a predetermined time after the application of the write command; and
- programming the third repair address in the second region in response to the second program command generated in the generating.

* * * * *